United States Patent
Waarts et al.

[11] Patent Number: 5,530,709
[45] Date of Patent: Jun. 25, 1996

[54] DOUBLE-CLAD UPCONVERSION FIBER LASER

[75] Inventors: Robert G. Waarts, Palo Alto; David F. Welch, Menlo Park; Steven Sanders, Mountain View; Donald R. Scifres, San Jose, all of Calif.

[73] Assignee: SDL, Inc., San Jose, Calif.

[21] Appl. No.: 301,544

[22] Filed: Sep. 6, 1994

[51] Int. Cl.$^6$ .................................................. H01S 3/30
[52] U.S. Cl. ........................................................... 372/6
[58] Field of Search ................................. 372/6, 126, 127, 372/142

[56] References Cited

U.S. PATENT DOCUMENTS

| | | | |
|---|---|---|---|
| 3,624,549 | 11/1971 | Geusic et al. | 331/94.5 |
| 4,949,348 | 8/1990 | Nguyen et al. | 372/41 |
| 5,008,890 | 4/1991 | McFarlane | 372/41 |
| 5,067,134 | 11/1991 | Oomen | 372/6 |
| 5,226,049 | 7/1993 | Grubb | 372/6 |
| 5,251,062 | 10/1993 | Switzer et al. | 372/6 |
| 5,291,501 | 3/1994 | Hanna | 372/6 |
| 5,321,718 | 6/1994 | Waarts et al. | 372/108 |

OTHER PUBLICATIONS

T. J. Whitley et al., "Upconversion Pumped Green Lasing in Erbium Doped Fluorozirconate Fibre", Electronics Letters, vol. 27 No. 20, Sep. 26, 1991, pp. 1785–1786.
D. Piehler et al., "Green laser diode pumped erbium fiber laser" presented at the Compact Blue–Green Lasers conference, Feb. 10–11, Jan. 1994, Salt Lake City, Utah.
W. Lenth et al., "Upconversion Lasers", Optics and Photonics News, Mar. 1992, pp. 8–15.
D. Piehler, "Upconversion process creates compact blue/green lasers", Laser Focus World, Nov. 1993, pp. 95–102.

*Primary Examiner*—Rodney B. Bovernick
*Assistant Examiner*—Robert E. Wise
*Attorney, Agent, or Firm*—Schneck & McHugh

[57] ABSTRACT

An upconversion fiber laser with a double-clad fiber is pumped with a laser-diode-based laser pump source, the inner cladding of the fiber forming a low transmission loss waveguide for the pump light. The central core of the fiber is doped with an active lasing ionic species capable of undergoing upconversion excitation, such as certain rare earth ionic species. The use of a double-clad fiber permits the use of high power, high brightness laser diodes, including those with broad emitting apertures, as well as high power diode laser pumped fiber lasers, as the pump source, thereby achieving higher pump intensities within the upconversion laser fiber and improved upconversion efficiency. Pump brightness can be further increased with multiple pump schemes which use multiple pump wavelengths in different absorption bands, multiple pump wavelengths within the same absorption band, pump light from pairs of cross-polarized sources, and pumping from both ends of the fiber.

36 Claims, 7 Drawing Sheets

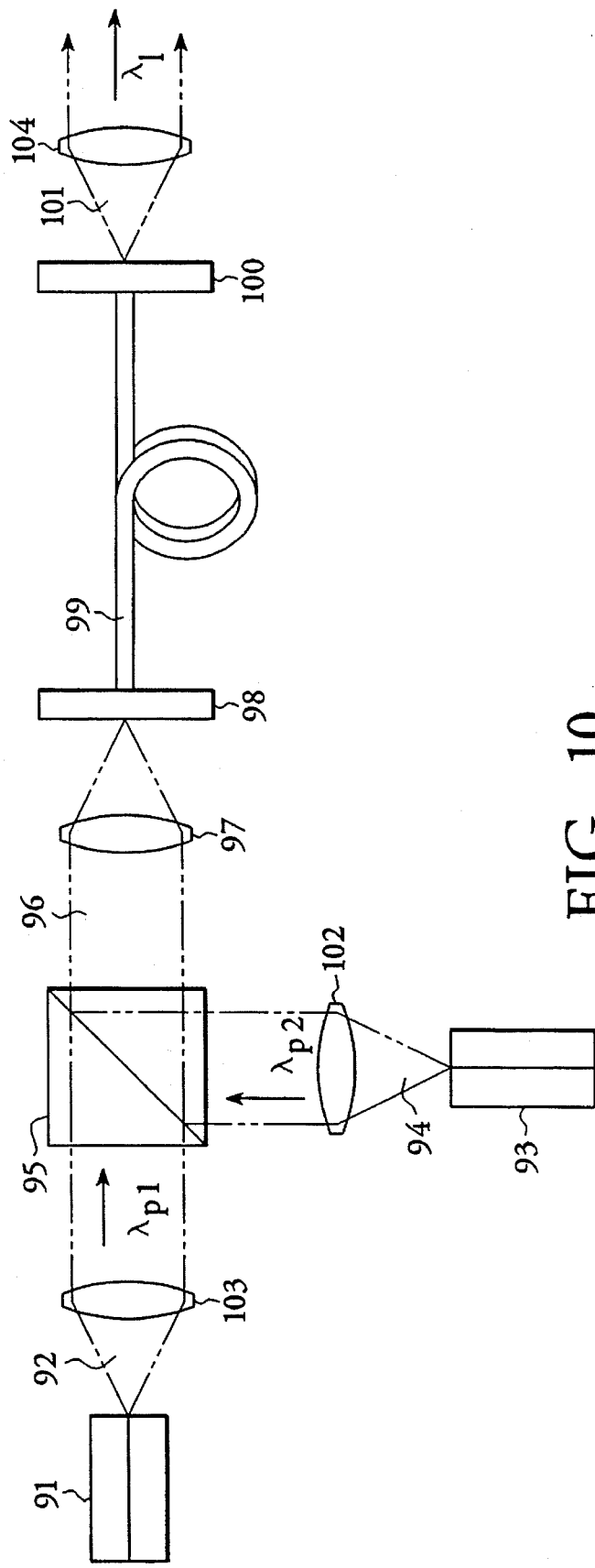
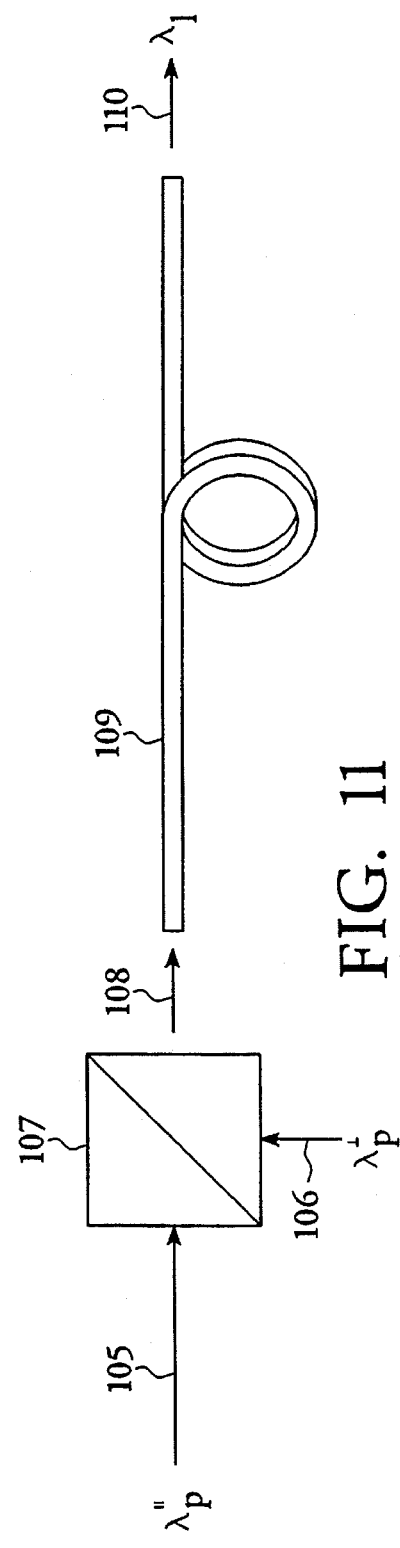
FIG. 10
FIG. 11

DOUBLE-CLAD UPCONVERSION FIBER LASER

TECHNICAL FIELD

The present invention relates to optical fiber lasers which are pumped to an excited state by means of an upconversion process, and in particular relates to diode-laser-pumped upconversion fiber lasers.

BACKGROUND ART

Upconversion lasers provide a promising alternative to frequency-doubled laser diodes for a reliable and efficient compact source of blue or green laser light. Unlike the conventional single-step optical pump process, in which absorption of one pump photon is sufficient to excite an active ion to the upper laser level and in which the laser light always has a lower photon energy, i.e. a longer wavelength, than the pump light, the upconversion pump process is a multi-step process in which more than one photon excites an active ion to the upper laser level and in which the laser light usually has a shorter wavelength than the pump light. Common upconversion processes include excited-state absorption of a second photon by the active ion, also called "two-step absorption", dipole-dipole cross-relaxation interactions between two excited ions, not necessarily of the same atomic species, and avalanche absorption involving a combination of both excited-state absorption and interionic cross-relaxation.

Upconversion solid-state lasers using rare-earth-doped crystal or glass rods as the active medium have been demonstrated. In U.S. Pat. No. 3,624,549, Geusic describes diode pumped solid state upconversion lasers in which a crystal rod is doped with $Er^{3+}$, $Ho^{3+}$ or $Tm^{3+}$ active ions and co-doped with $Yb^{3+}$ sensitizer ions. The sensitizer ions absorb the 0.93 µm emission from silicon and indium doped GaAs diode pumps, and transfer the energy to the lasing active ions to produce 550 nm, 660 nm or 410 nm laser emission for erbium ($Er^{3+}$), 540 nm laser emission for holmium ($Ho^{3+}$), and 470 nm laser emission for thullium ($Tm^{3+}$), respectively. In U.S. Pat. No. 4,949,348, Nguyen et al. describe a thullium-doped solid-state upconversion laser which is double-pumped with both 781 nm GaAlAs and 649 nm InGaAlP laser diodes to produce a 450 nm laser emission. In U.S. Pat. No. 5,008,890, McFarlane describes an erbium-doped solid-state upconversion laser which is pumped either by a 797 nm laser diode or by a diode-laser-pumped $Nd^{3+}$-doped 1.06 µm solid state laser. The erbium upconversion laser lases at 551 nm or one of several other wavelengths.

Upconversion fiber lasers, using rare-earth-doped single-mode fluoride-glass fibers, have also been demonstrated. In U.S. Pat. No. 5,067,134, Oomen describes a diode-laser-pumped thullium upconversion fiber laser which lases at about 450 nm wavelength. The fiber can be co-doped with terbium or praseodymium. In U.S. Pat. No. 5,226,049, Grubb describes thullium and holmium upconversion fiber lasers. The pump source may be either a laser diode emitting 1120 nm radiation or a Nd:YAG laser which has been adjusted to suppress 1064 nm and 1074 nm emissions and to enhance 1112 nm, 1116 nm and 1123 nm output. The thullium laser produces 480 nm or 650 nm laser light, while the holmium laser produces 550 nm laser light. T. J. Whitley et al., in *Electronics Letters* 27 (20), 26th Sep. 1991, pages 1785–1786, describe an erbium upconversion fiber laser pumped by an 801 nm laser diode and emitting 546 nm laser radiation. D. Piehler et al., in an article entitled "Green laser diode pumped erbium fiber laser" presented at the *Compact Blue-Green Lasers* conference, held Feb. 10–11, 1994 at Salt Lake City, Utah, describes work done in 1993 on an erbium-doped fluoride fiber upconversion laser which is pumped with a 971 nm laser diode and which emits 544 nm laser radiation. The laser diode pump source is fiber coupled to the upconversion fiber. Piehler et al. also note the prior art's simultaneous pumping of a praseodymium-doped fluoride fiber upconversion laser with both an 833 nm laser diode and either a 985 nm or 1016 nm laser diode to produce either 635 nm or 521 nm laser emission. The fiber core in that laser is co-doped with ytterbium.

W. Lenth et al. in *Optics and Photonics News*, March 1992, pages 8–15, survey prior work on solid state and fiber upconversion lasers. Among the systems noted in the article are thullium lasers pumped with 648 nm light or double pumped with both 647 nm and 676 nm light and lasing at 480 nm or 483 nm. Erbium lasers are pumped with 800 nm light or double pumped with both 792 nm and 840 nm light and lase at 550 nm. Praseodymium lasers are double pumped with both 835 nm and 1010 nm light and lase at 491 nm, 520 nm, 605 nm, 635 nm or 715 nm wavelengths.

D. Piehler, in *Laser Focus World*, November 1992, pages 95–102, also surveys prior art upconversion fiber lasers. Among the lasers disclosed are a 480 nm thullium laser pumped with a diode-pumped Nd:YAG fiber laser providing 1120 nm pump radiation. Also, a praseodymium laser, lasing at 635 nm, 520 nm or 490 nm, is pumped by a diode-laser-pumped ytterbium fiber laser. The ytterbium fiber laser pump employs an intrafiber Bragg reflector to force emission of 1020 nm pump radiation.

Diode-laser-pumped single-mode rare-earth-doped fluoride-glass fibers are the preferred medium for upconversion. Upconversion efficiency increases with pump intensity. Single-mode fibers (10 µm core diameter or less) can confine the pump and laser radiation to a very small area over the length of these fibers (often several meters long), and create very high optical intensities and large single-pass gains from only modest pump powers. This makes room temperature cw operation of an upconversion laser possible. In comparison with solid-state crystal media, the glass medium used for fiber lasers has broader absorption and emission bands, so the laser diode pump sources need not be frequency stabilized and the laser output is tunable to some degree (over approximately a 10 nm range). Fluoride glass fibers are especially advantageous, because the lower phonon energies, and thus smaller vibrational decay rates, of this material lead to increased excited-state lifetimes and a relative abundance of the metastable intermediate states required for effective upconversion.

An object of the invention is to increase the amount of usable pump light injected into an upconversion laser fiber for improved upconversion efficiency and higher laser power output.

Another object of the invention is to provide an upconversion fiber laser which can employ higher brightness pump sources than previously possible.

DISCLOSURE OF THE INVENTION

These objects have been met with a diode laser pumped upconversion fiber laser which uses double-clad fibers. Such fibers have a small diameter central core, preferably supporting only a single spatial mode of light propagation, which is doped with an active lasing ionic species capable of undergoing upconversion excitation when it is optically pumped, and which serves as a waveguide for upconversion laser light, surrounded by an inner cladding having a lower refractive index than the central core for confining the upconversion laser light in the central core, and which serves as a low loss multimode waveguide for the pump light, and an outer cladding of lowest refractive index surrounding the inner cladding for confining the pump light to the inner cladding and central core. The use of double-clad fibers permits the use of high power (at least 100 mW) multimode or broad-area laser diode pump sources, such as laser bars, MFA-MOPAs or flared-resonator-type laser diodes, as well as use of high power diode-laser-pumped fiber-laser pump sources. Thus, the double-clad upconversion fiber laser of the present invention includes a laser-diode-based laser pump source which is optically coupled at one end of the double-clad fiber to both the central core and inner cladding of the fiber, instead of just to the small diameter central core. The higher power and brightness levels from the pump sources which are able to be coupled to double-clad fibers provides increased pump light intensities in the fiber core and achieves improved upconversion efficiency.

Specific embodiments of the invention further increase pump brightness by combining multiple pump sources. Light from two or more pump sources with different wavelengths within the same broad pump absorption band of the active ions can be combined using a wavelength-division beamsplitter combiner before being coupled into the optical fiber. Two pump sources of the same wavelength but with crossed linear polarizations may be combined in a polarization beam combiner to double the pump brightness. A combination of these two techniques could also be employed. Several upconversion lasers either require or are more efficient with multiple pump wavelengths in different pump absorption bands of the active ions. Pump light can also be injected into both ends of the fiber.

The resonant cavity for the upconversion fiber may be defined by external mirrors, reflective coatings on the end surfaces of the fibers, or gratings formed within the fibers. These cavity reflectors, while reflective of the upconversion laser wavelengths and any desired co-lasing wavelengths, should be transmissive of the pump wavelength at the pump light input end (or ends) of the fiber. The resonant cavity may entirely contain the laser fiber to form a simple laser, or alternatively, may contain only a portion of the fiber to form a MOPA device with the fiber portion lying outside of the cavity being an optical power amplifier for the upconversion laser light received from the master oscillator portion of the fiber within the laser cavity. Two lasers can operate simultaneously in a single double-clad fiber, where a laser diode pump source injects pump light into the central core and inner cladding which are both doped with an active laser ionic species to generate conventional, i.e., non-upconversion laser light within the fiber cavity, which in turn serves as pump light for upconversion of another active laser ionic species in the central core.

BRIEF DESCRIPTION OF THE DRAWINGS

FIGS. 10–14 are schematic side views of additional upconversion fiber laser embodiments of the present invention illustrating different pumping schemes.

BEST MODE OF CARRYING OUT THE INVENTION

Figure 1:
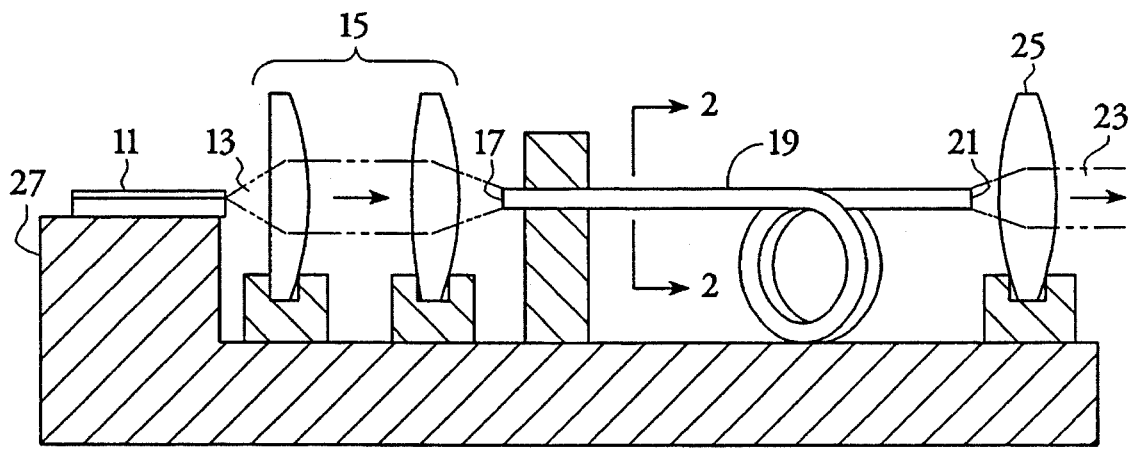
FIG. 1 is a schematic side view of a diode-laser-pumped upconversion fiber laser of the present invention.

With reference to FIG. 1, an upconversion fiber laser of the present invention includes a laser diode pump source 11 emitting laser pump light 13 which is optically coupled by means of a lens or lens system 15 to an input end 17 of an optical fiber 19 that is doped with an active laser ionic species capable of upconversion excitation, such as certain rare earth ions. A resonant cavity may be defined by laser wavelength reflective coatings on the end surfaces 17 and 21 of the fiber 19, external mirrors or intrafiber grating reflectors. Laser light 23 is emitted from an output end 21 of the fiber 19 and may be collimated or focused by another lens or lens system 25. The laser elements 11–25 may be mounted together on a common base 27 in a laser package.

The active laser ionic species is preferably a rare earth ionic species, such as $Tm^{3+}$ (thullium), $Er^{3+}$ (erbium), $Pr^{3+}$ (praseodymium) or $Ho^{3+}$ (holmium), because of the large number of intermediate metastable states available for upconversion using the red or near infrared pump wavelengths of laser-diode-based pump sources. For example, $Er^{3+}$ ions may be pumped at either 970 nm or 801 nm to produce 546 nm laser light. $Tm^{3+}$ ions may be pumped at 1120 nm to produce either 480 nm or 540 nm laser light. $Ho^{3+}$ ions may be pumped at 890 nm to produce 550 nm laser light. $Pr^{3+}$ ions may be pumped with both 835 nm and 1010 nm light to produce any of 520 nm, 491 nm, 605 nm or 635 nm laser light. The laser fiber 19 may also be co-doped with other rare earth ionic species, which function as sensitizer ions facilitating the upconversion process. For example, $Tm^{3+}$ laser fibers may be co-doped with $Nd^{3+}$ (neodymium) ions and pumped with 808 nm light, or co-doped with $Yb^{3+}$ (ytterbium) ions and pumped with 980 nm light, to produce 480 nm laser light. Likewise, $Ho^{3+}$ laser fibers may be co-doped with $Yb^{3+}$ ions and pumped with 930 nm light to produce 550 nm laser light. Other ions, including $Nd^{3+}$, $Yb^{3+}$ and $Tb^{3+}$ (terbium) ions, with or without co-doping, are also possible upconversion laser active ions.

Figure 2:
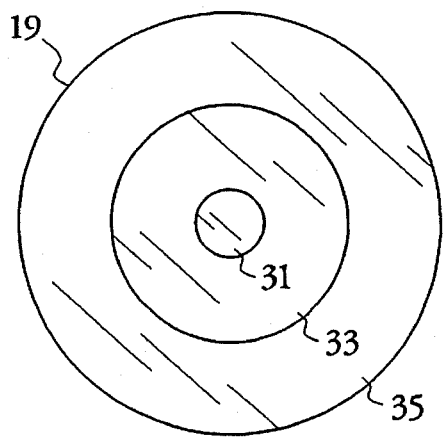
FIG. 2 is a sectional view of a double-clad optical fiber used in the laser of FIG. 1.
Figure 3:
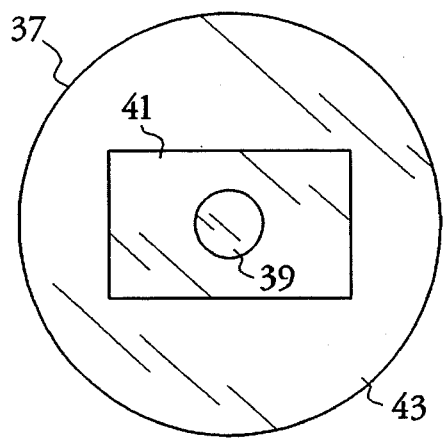
FIGS. 3, 4 and 5 are sectional views of alternative optical fiber embodiments for use in the laser of FIG. 1.
Figure 4:
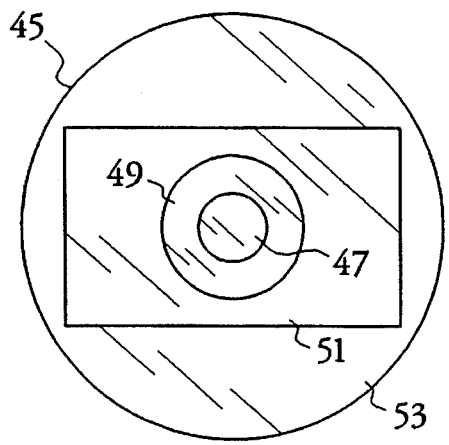

The optical fibers 19 used in the upconversion lasers of the present invention are double-clad fibers, such as those illustrated in cross-section in FIGS. 2–4. The fiber core material serving as a host for the active laser ions is preferably a fluoride glass because of this material's long-lived intermediate states and broad pump absorption bands. The glass may be formed from a suitable mixture of some or all of $ZrF_4$, $HfF_4$, $BaF_2$, $SrF_2$, $LaF_3$, $YF_3$, $AlF_3$, KF, NaF and LiF (or other suitable fluorides.) in any combination. Fluorozirconate fibers (containing $ZrF_4$ as the primary ingredient), such as ZBLAN, are widely available in the fiberoptic telecommunications industry. The refractive index can be varied to produce the fiber cladding material by varying the compositional mix of the fiber, such as by adjusting the $ZrF_4/HfF_4$ ratio. While fluoride (especially fluorozirconate) fibers are preferred, other fiber materials, such as phosphate, silicate, borate and borosilicate glasses could also be used.

In FIG. 2, a double-clad fiber 19 has a central core 31 doped with an active laser ionic species capable of undergoing upconversion excitation when optically pumped. The fiber 19 also has an inner cladding 33 surrounding the central core with a lower refractive index than the central core for substantially confining the laser light to the core. Surrounding the inner cladding 33 is an outer cladding 35 of still lower refractive index. The inner cladding 33 forms a low transmission loss waveguide for the pump light 13 emitted by the laser diode pump source. The central core 31, forming the waveguide for the laser light generated therein, is a small diameter core which preferably supports only a single spatial mode of light propagation. The core diameter is generally at most 10 µm. The inner cladding 33 has an outer diameter which is typically in a range from 25 µm to 250 µm, and, together with the central core 31 which it surrounds, is capable of supporting multiple spatial modes of propagation of the pump light. Pump light propagating in the inner cladding 33 leaks into the higher index core 31 along the length of the fiber 19. (The optical fiber 19 is typically several meters long.) Pump light might also be injected into the fiber from both ends, as discussed with reference to FIG. 10 below.

In FIG. 3, an alternative double-clad fiber 37 includes a small diameter central core 39 as in FIG. 2 which is surrounded by a large area inner cladding 41 with a rectangular shape. This inner cladding 41 is in turn surrounded by an outer cladding 43, which can be either round (as shown) or rectangular in cross-section. The rectangular cross-section of the inner cladding 41 better accommodates the shape of the pump light emitted from laser diode pump sources, particularly high power laser diodes, thereby achieving improved filling of the waveguide (inner cladding 41 and central core 39) by the pump light and thus allowing better brightness conservation of the pump light in the fiber for improved upconversion efficiency. The round waveguide 33 in the fiber in FIG. 2 requires more complex coupling optics 15 in the laser of FIG. 1 to shape the pump beam for maximum coupling. Another feature of the rectangular inner cladding 41 in FIG. 3 is polarization preservation of the pump light, which is advantageous in the pump scheme shown in FIG. 11 where two orthogonally linearly polarized pump beams are combined and coupled into the optical fiber. Other noncircular cross-sections (e.g., elliptical) for the inner cladding 41 could also be used.

In FIG. 4, yet another optical fiber 45 which can be used in the present invention has two concentric central cores 47 and 49 surrounded by an inner cladding 51 like that shown in FIG. 3 and an outer cladding 53. The inner core 47 has the highest refractive index, outer core 49 has a lower refractive index, inner cladding 51 has an even lower refractive index and outer cladding 53 has the lowest refractive index. Both cores are small diameter cores, preferably single mode cores. The outer core 49 has a typical outer diameter of at most 10 µm, while inner core 47 has an even smaller diameter of about 3–6 µm. This double core fiber 45 may be used in a fiber laser in which two lasers operate simultaneously, one an upconversion fiber laser and the other a non-upconversion fiber laser surrounding and overlapping the upconversion fiber laser and serving as a pump for the upconversion fiber laser. In such a co-lasing fiber laser embodiment, the inner core 47 is doped with an active lasing ionic species capable of undergoing upconversion excitation, such as $Tm^{3+}$ (thullium). The outer core 49 is doped with and the inner core 47 is preferably co-doped with a second active lasing ionic species, such as $Nd^{3+}$ (neodymium). Pump light from a laser diode pump source having a wavelength that pumps the second active lasing ionic species (808 nm for $Nd^{3+}$) is coupled into the inner cladding 51 and cores 47 and 49 to cause lasing action of those ions. A low power injection lock signal from a single mode laser diode is preferably coupled into cores 47 and 49, or wavelength selective gratings are fabricated in the fiber end, to lock the lasing wavelength of this second ionic species within the pump absorption band for upconversion of the first ionic species. (For upconversion of $Tm^{3+}$, the $Nd^{3+}$ laser needs to be locked at about 1.12 µm instead of the usual 1.06 µm emission of neodymium lasers.) Upconversion efficiency is improved in this scheme because the cavity reflectors for the non-upconversion laser need not couple any of this light out of the cavity, because it is generally used only for intracavity pumping of the upconversion laser.

Figure 5:
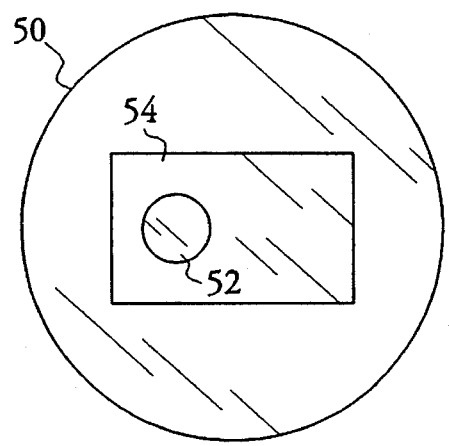

FIG. 5 shows yet another fiber embodiment 50 in which the central core 52 is not centered in the inner cladding 54. Any of the fiber configurations in FIGS. 2–4 can have such an asymmetric positioning of the central core (or cores) relative to the inner cladding. Depending on the intensity profile of the pump light within the inner cladding 54, the absorption of the pump light within the central core 52, and possibly other factors, the off-center positioning may operate more efficiently than a symmetric fiber configuration.

With reference to FIGS. 6–9, the laser-diode-based laser pump source for the upconversion fiber laser of FIG. 1 may be a high power laser diode, such as a monolithically integrated laser diode array, a broad area laser diode, a flared-resonator-type laser diode, or a monolithic flared-amplifier-type MOPA device. Such lasers generally provide at least 100 mW of pump light to the central core and inner cladding of a double-clad optical fiber, and especially in the case of laser diodes of the type having broad emitting apertures, usually provide 0.5 W or more of pump light. The laser pump source may also be a laser-diode-pumped fiber laser, such as a $Nd^{3+}$ fiber laser.

Figure 6:
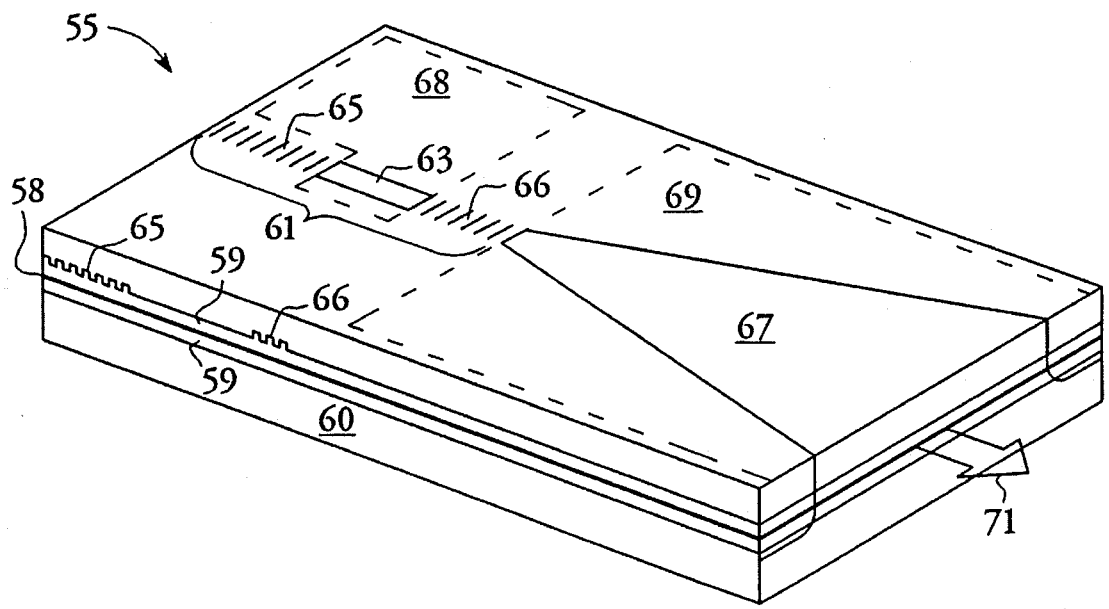
FIG. 6 is a perspective view of a MOPA device used as a diode-laser-based pump source in the laser of FIG. 1.

In FIG. 6, a monolithic flared-amplifier-type MOPA device 55 comprises a semiconductor heterostructure, including a quantum well active region 58 sandwiched between waveguide cladding layers 57 and 59 disposed on a substrate 60. A master oscillator 61, with a single mode waveguide 63 and a pair of DBR grating reflectors 65 and 66, optically couples to a flared optical power amplifier 67. Separate surface contacts 68 and 69 facilitate current injection for pumping the oscillator's waveguide region 63 and the flared amplifier region 67. Optical power is emitted as a broad beam 71 from the wide end of the flared amplifier 67. Other MOPA structures, such as those with DFB oscillators and those with differential pumping of the flared amplifier region, could also be used. The MOPA's heterostructure could be based on any III-V semiconductor material system, including GaAlAs, InGaAs and InGaAsP material systems, the choice of semiconductor material being primarily dependent on the desired emission wavelength.

Figure 7:
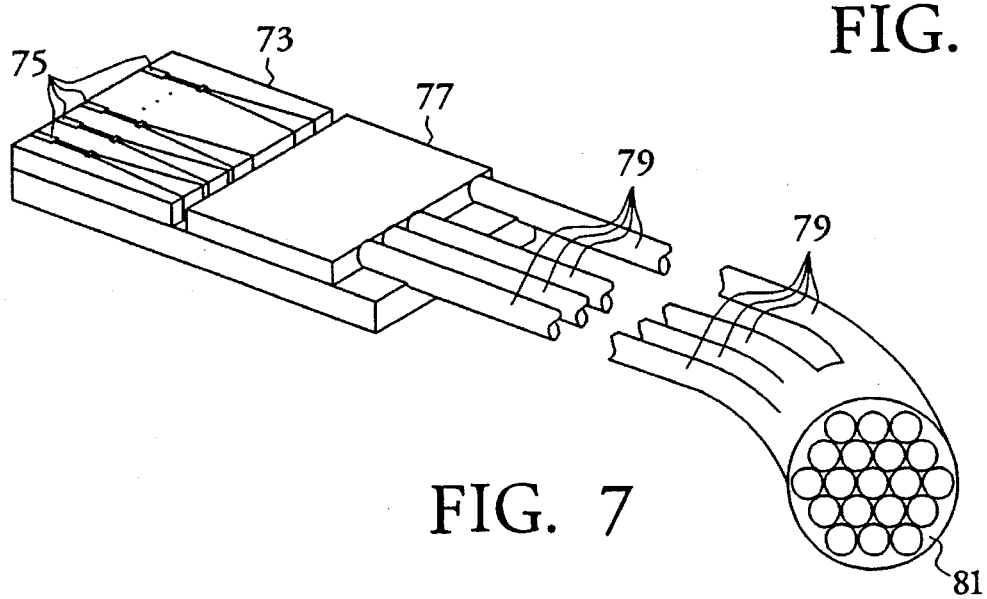
FIG. 7 is a perspective view of a second embodiment of the present invention forming an upconversion fiber laser array.

In FIG. 7, a monolithic array 73 of MOPA devices 75 is coupled through optics 77 to a corresponding array of optical fibers 79 forming a fiber bundle 81. These optical fibers 79 may be simple transmission fibers for coupling the optical power from the multiple MOPA device 75 into a single double-clad upconversion fiber. Alternatively, the fibers 79 may form a set of fiber lasers providing laser pump power to the upconversion fiber or to a corresponding bundle of upconversion fibers. Still further, these fibers 79 may themselves be the double-clad upconversion laser fibers which are pumped directly by the array of MOPAs 75.

Figure 8:
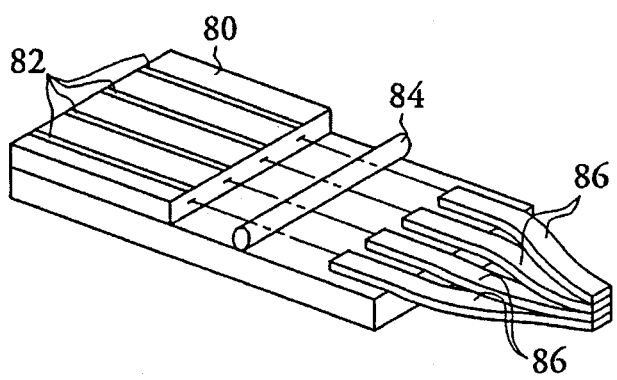
FIG. 8 is a perspective view of a third embodiment of the present invention.

In FIG. 8, another monolithic laser array 80 with multiple laser elements 82 is coupled through a cylinder lens 84 into a corresponding array of optical fibers 86, which again form a fiber bundle at their output. The cylinder lens 84 serves to lower the vertical beam divergence from the laser elements 82 to about 10° or less. The fibers 86 may be rectangular fibers, as shown, or circular fibers, as seen in FIG. 7. The repositioning of the fibers 86 at the output end serves to convert the broad emitting area of the array 80 into a shape more suitable for coupling into the double core fibers of FIGS. 2–5.

Figure 9:
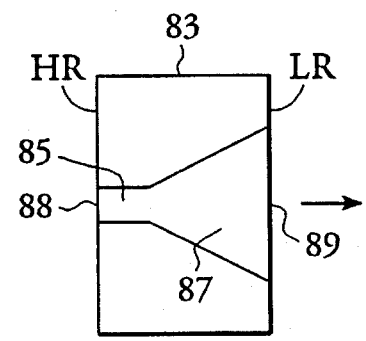
FIG. 9 is a top plan view of a flared-resonator-type laser diode used as an alternative pump source to the MOPA device of FIG. 5.

In FIG. 9, instead of a MOPA device, a flared-resonator-type laser diode 83 may be used to pump a double-clad upconversion fiber. Such a laser 83 has a construction similar to the flared MOPA device 55 in FIG. 5, but without the DBR gratings 65 and 66 of the MOPA's oscillator 61. A single spatial mode waveguide 85 is optically coupled to a broader gain guided or unguided region 87, preferably a flared region, between facet reflectors 88 and 89. These facet reflectors are preferably coated for high reflectivity (HR) from rear reflector 88 and lower reflectivity (LR) from the front reflector 89, which also serves as the light emitting surface of the laser. The laser light freely diverges in the broad flared region 87 so only the most central rays will couple back into the waveguide 85. Other similar high power laser structures are also possible, including some with external cavity reflectors, possibly gratings, and some with the narrow aperture end of the flared region 87 serving as a spatial mode filter without the waveguide 85.

With reference to FIG. 10, an upconversion fiber laser embodiment employing two laser-diode-based laser pump sources 91 and 93 of different wavelengths $\lambda_{p1}$ and $\lambda_{p2}$ is shown. Some upconversion lasers require multiple pump wavelengths in order to produce upconversion. For example, as previously mentioned, $Pr^{3+}$ (praseodymium) ions must be pumped with both 835 nm and 1010 nm light in order to lase at any of the 520 nm, 491 nm, 605 nm, or 635 nm wavelengths. A dichroic beamsplitter 95 may be used to combine the pump light 92 and 94 into a single beam 96. Such a beamsplitter 95 would be transmissive of the first pump wavelength $\lambda_{p1}$ but reflective of the second pump wavelength $\lambda_{p2}$. Alternatively, other known beam combining optics could be used. The combined beam 96 is focused by a lens system 97 into an end of the upconversion fiber 99. Cavity reflectors 98 and 100, which may be external to the fiber 99 as shown or internal fiber gratings, reflect the laser light, to provide resonant feedback for the laser, while at least the reflector 98 on the pump input end of the fiber 99 is transmissive of the two pump wavelengths $\lambda_{p1}$ and $\lambda p_2$. Reflector 100 at the output end of the fiber 99 may be highly reflective of the pump light, and somewhat less reflective of the laser light to permit coupling of the laser light 101 out of the fiber 99. Additional optics 101–104 shape and collimate the respective laser beams emitted from the two pump sources 91 and 93 and the fiber laser 99.

The configuration shown in FIG. 10 could also be used to increase upconversion efficiency in lasers that only require a single pump wavelength, but which have broad pump absorption bands. In such a case, the two pump wavelengths $\lambda_{p1}$ and $\lambda_{p2}$ differ, but still correspond to the same pump absorption band of the upconversion fiber laser. Glass hosts in general tend to cause a broadening of the energy levels by means of vibrational-electronic (vibronic) interactions. For example, while $Tm^{3+}$ (thullium) upconversion lasers are typically pumped at about 1120 nm in most single wavelength pump schemes for maximum efficiency, pumping at multiple wavelengths in a broad 1080 nm to 1300 nm range is also possible. The configuration shown in FIG. 10 is one way to provide such multiwavelength pumping.

With reference to FIG. 11, another pumping configuration doubles the brightness of the injected light by combining two crossed (orthogonal) linearly polarized pump beams 105 and 106 of substantially the same wavelength $\lambda_p$. A polarization beamsplitter 107 can be used to combine the two pump beams 105 and 106. The beamsplitter 107 transmits light $\lambda_p^{\shortparallel}$ of a first polarization, but reflects light $\lambda_p^{\perp}$ of a second polarization, and thereby outputs a combined beam 108 for injection via coupling optics (not shown) into the upconversion laser fiber 109. Resonant cavity feedback for the fiber laser 109 may be provided by gratings formed within the fibers, coatings on the fiber end surfaces or external reflectors as in FIG. 10. The laser outputs a light beam 110 which generally has a shorter wavelength $\lambda_1$ than the pump light $\lambda_p^{\shortparallel}$ and $\lambda_p^{\perp}$.

Figure 12:
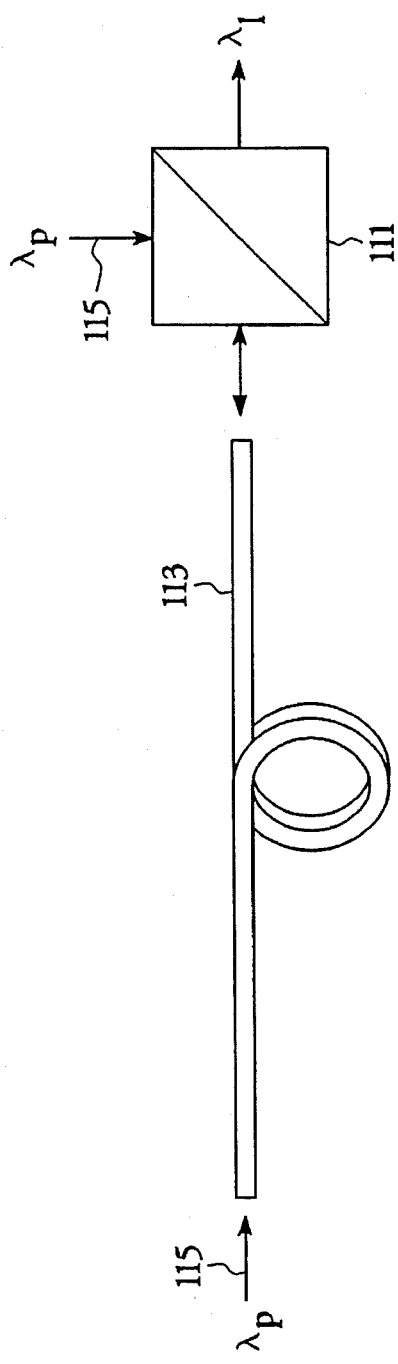

With reference to FIG. 12, yet another pumping configuration uses a dichroic or other wavelength-division beamsplitter 111 at the output end of the laser fiber 113 to allow injection of pump light 115 from both ends of the fiber 113. The beamsplitter 111 is transmissive of the laser wavelength $\lambda_1$, but reflective of the pump wavelength $\lambda_p$.

A combination of any of the pumping schemes shown in FIGS. 10–12 could also be employed. Thus, multiple pump wavelengths in different absorption bands, multiple pump wavelengths within the same absorption band, combining pump light from pairs of cross-polarized sources, and pumping from both ends of the upconversion laser fiber could be used together in any combination.

Figure 13:
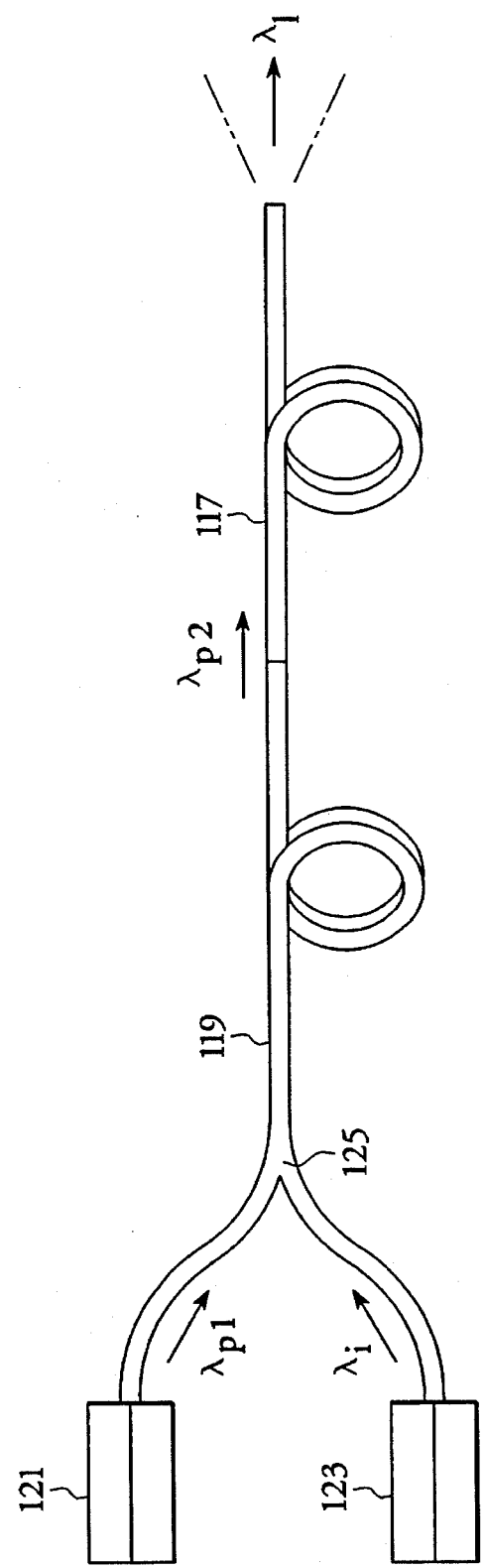
Figure 14:
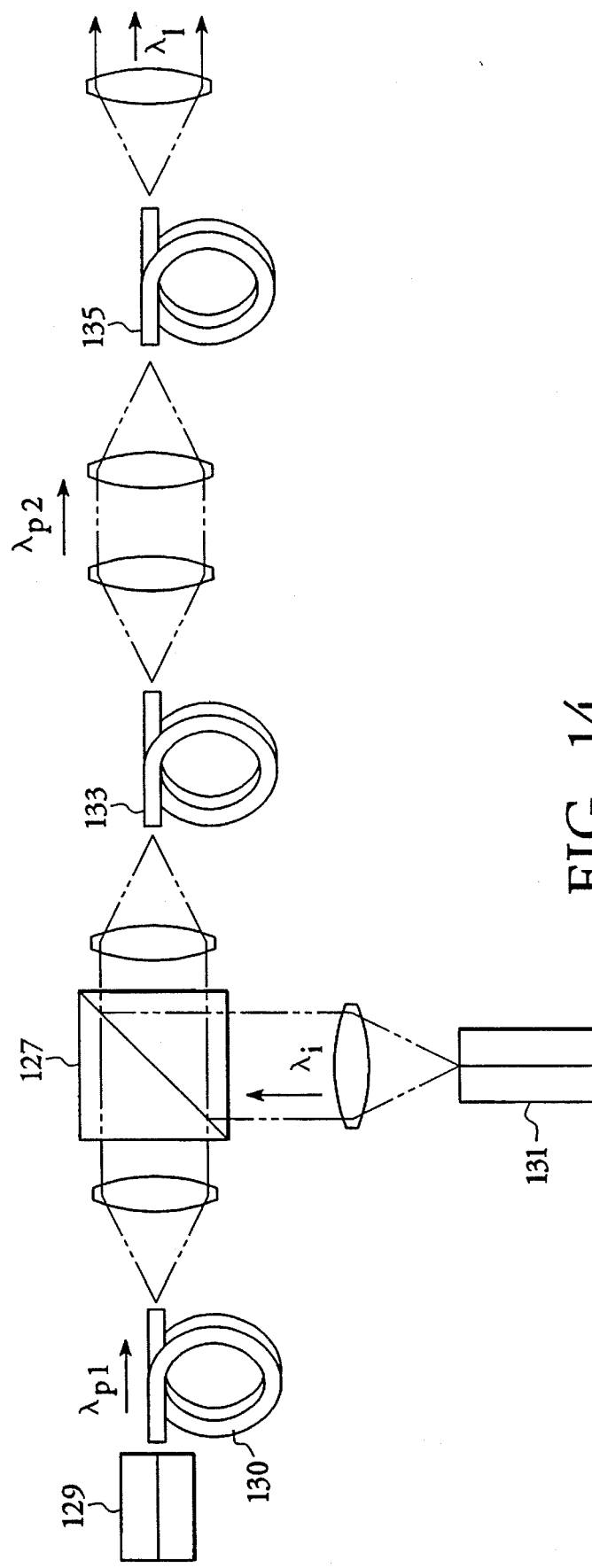

With reference to FIGS. 13 and 14, the laser-diode-based laser pump source for the upconversion fiber laser could be a laser-diode-pumped fiber laser instead of a high power laser diode. For example, a $Tm^{3+}$ (thullium) upconversion fiber laser can be pumped by a $Nd^{3+}$ (neodymium) fiber laser providing 1.12 µm pump light. In FIG. 13, the double-clad upconversion laser fiber 117 receives pump light of wavelength $\lambda_{p2}$ and produces a laser output of wavelength $\lambda_1$. The fiber laser pump source comprises a fiber 119 doped with active lasing ions (such as $Nd^{3+}$ ions) optically coupled to a laser diode pump 121 which provides pump light of wavelength $\lambda_{p1}$ (about 808 nm for a $Nd^{3+}$ fiber laser) to the fiber 119. Like the upconversion fiber 117, the laser fiber 119 for the pump may also be a double-clad fiber, so as to allow coupling of a high power laser diode pump source 121, particularly one with a broad emitting aperture, to the fiber 119. Otherwise, a single-mode laser diode could be used to pump a single-clad fiber laser. Because the output $\lambda_{p2}$ of the fiber laser 119 must match a pump absorption band of the upconversion fiber laser 117, an injection lock 123 may be necessary to force emission within that wavelength band. For example, $Nd^{3+}$ fiber lasers ordinarily lase at about 1.06 µm instead of the desired 1.12 µm for pumping a $Tm^{3+}$ upconversion fiber laser. A single mode laser diode 123 tuned to emit light of wavelength $\lambda_i$ which equals the desired pump output wavelength $\lambda_{p2}$ may be coupled to the laser fiber 119 to lock the light at that desired wavelength.

In FIG. 13, both the pump diode 121 and injection locking diode 123 are coupled to the laser fiber 119 by means of a branching fiber connection 125. Alternatively, in FIG. 14, a dichroic or other wavelength-division beamsplitter 127 is used to optically couple the pump diode 129 and injection lock diode 131 to the laser fiber 133 providing the pump light $\lambda_{p2}$ to the upconversion fiber 135. Further, one or more of the laser diodes, such as diode 129, may be remotely coupled to the beamsplitter 127 via a light transmissive optical fiber waveguide 130. Lens systems are used, where needed, to shape, collimate and focus the light beams from the various laser components.

Figure 15:
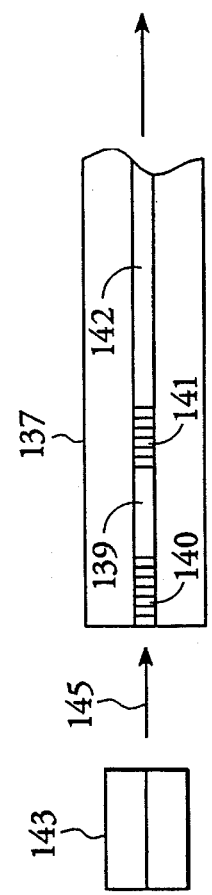
FIG. 15 is a schematic side view of an upconversion fiber MOPA of the present invention.

With reference to FIG. 15, the upconversion fiber laser of the present invention may be a fiber MOPA device in which a portion 142 of the optical fiber 137 lies outside of the laser resonant cavity 139–141 and acts as an optical power amplifier for the laser light generated within the cavity. The resonant cavity is defined by two spaced apart DBR gratings 140 and 141 bound by a portion 139 of the fiber core. The optical amplifier portion 142 of the fiber core is optically coupled through the reflective grating 141 to the laser oscillator portion 139 of the fiber core. The fiber 137 is shown for simplicity without distinguishing the inner and outer claddings, but would in general be such a double-clad fiber. A laser-diode-based laser pump source 143 provides pump light 145 to all fiber core portions 139–142.

Lenses or lens systems are generally used to shape, collimate and focus the light beams emitted from various components of the present invention. For example, in the laser embodiment shown in FIG. 1, the lens system 15 is used to couple the light 13 from the laser diode pump source 11 into the laser fiber 19, while another lens 25 is used at the output of the fiber 19 to collimate the laser light 23. Likewise, lenses or lens systems (depicted as simple lenses for simplicity) are also used in the other upconversion fiber laser embodiments of the present invention. In particular, it is usually necessary to reshape the outputs from the high power laser diode pump sources with broad emitting apertures or formed of monolithic linear arrays of multiple laser light emitting elements, since such outputs are highly asymmetric in both shape and divergence. Anamorphic lenses or lens systems, including cylindrical, ellipsoidal and toroidal lenses, may be used for this purpose. The problem is particularly severe with the flared-amplifier-type MOPA devices and the flared-resonator-type laser diodes shown in FIGS. 6, 7, and 9, since the output beam from these sources is not only highly asymmetric but also astigmatic. Astigmatism-correcting lens systems for such pump sources are described in U.S. Pat. No. 5,321,718, and may be used here.

Figure 16:
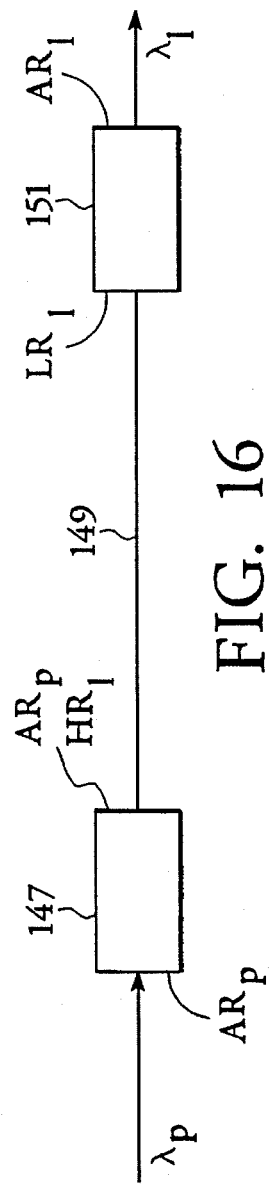
FIGS. 16–19 are schematic side views of still further upconversion fiber laser embodiments of the present invention illustrating different graded-index (GRIN) lens coupling schemes for the pump light.

With reference to FIGS. 16–19, graded index (GRIN) lenses may be used to both couple the light into and out of the upconversion fiber laser and form the required feedback mirrors at the fiber ends. Advantages of this approach include reducing the number of bulk optical elements in the fiber laser system, simplifying the mirror coating procedure by forming the coatings on the GRIN lens surfaces rather than the fragile fiber end surfaces, directly coupling the pump light from a laser diode pump source into the fiber without the need for special collimation optics, and direct coupling between two fiber lasers without the need for additional bulk optical components between the fibers. FIG. 16 shows the basic configuration. Pump light $\lambda_p$ from a diode based pump source or a preceding laser fiber passes through and is focused by a first GRIN lens 147 into the laser fiber 149. Laser light $\lambda_l$ is collimated at the fiber output or focused into another laser fiber by a second GRIN lens 151. The first GRIN lens 147 must be transmissive of the pump light $\lambda_p$ and is antireflection $(AR_p)$ coated at that wavelength on both surfaces. The lenses 147 and 151 must also be reflective of the laser light $\lambda_l$ and are reflection $(HR_l$ and $LR_l)$ coated at the surfaces adjacent to the fiber 149. The coating for the GRIN lens 151 should be partially transmissive of the laser light $\lambda_l$ for output coupling and thus has a lower reflectivity $(LR_l)$ coating than the corresponding high reflectivity $(HR_l)$ coating on lens 147. The output surface of lens 151 is antireflection $(AR_l)$ coated at the laser wavelength $\lambda_l$ to reduce loss.

Figure 17:
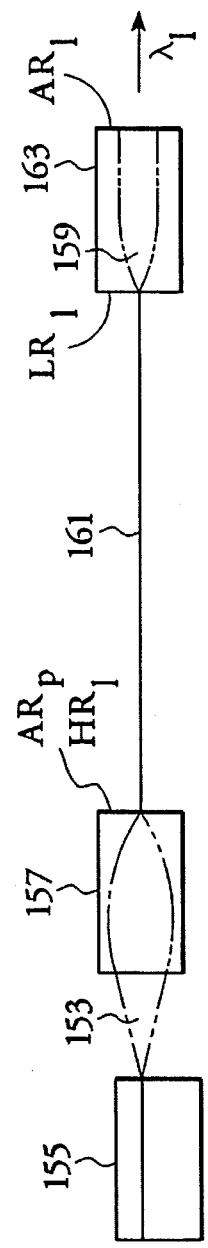
Figure 18:
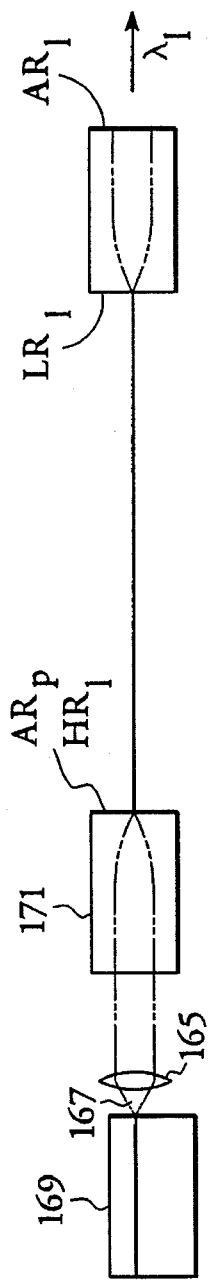
Figure 19:
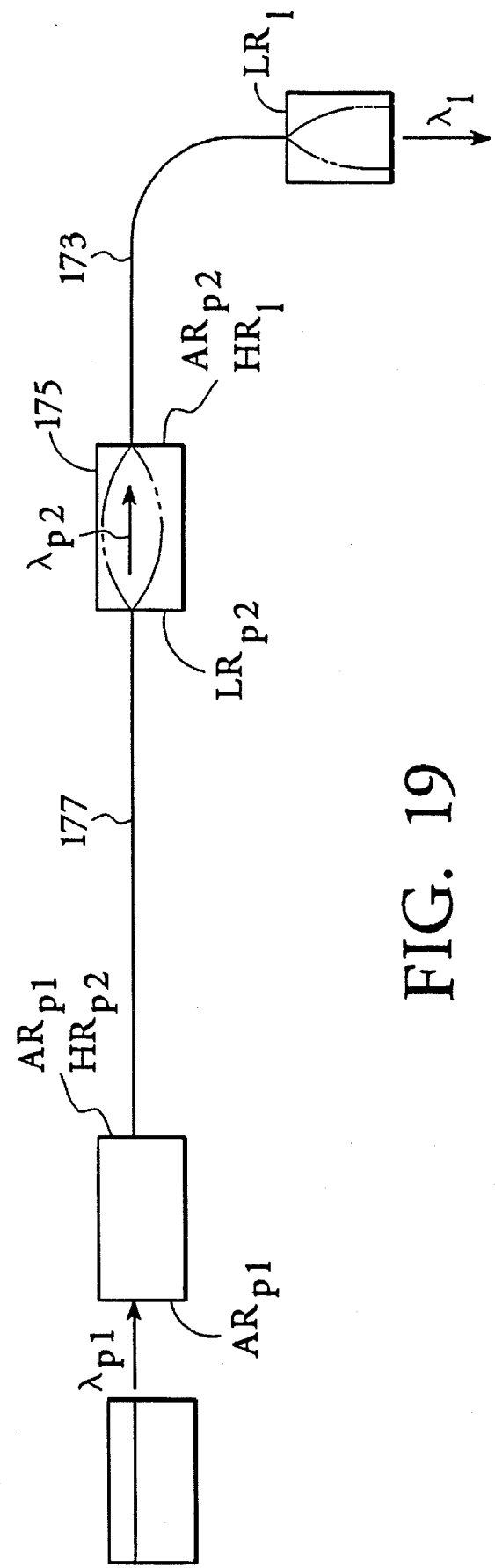

FIGS. 17–19 detail the strengths of the several GRIN lenses for various laser systems of the present invention. In FIG. 17, the divergent pump light 153 from the laser diode 155 is focused by the first GRIN lens 157, while the divergent laser light 159 from the laser fiber 161 is collimated by the second GRIN lens 163. Typically, lens 157 has a pitch between 0.25 and 0.50, while lens 159 has a pitch of 0.25. In FIG. 18, a similar system is shown, but here a collimating lens system (possibly beam shaping and astigmatism-correcting as well) 165 is first used to collimate the divergent light 167 from the laser diode pump source 169 before coupling it into the first GRIN lens 171. Lens 171 has a pitch of 0.25 for focusing the previously collimated pump light. In FIG. 19, the fiber laser system of FIG. 17 or 18 is used to pump a succeeding laser fiber 173. In this case, the second GRIN lens 175 has a 0.5 pitch to focus the divergent laser light $\lambda_{p2}$ from the first fiber 177 into the second fiber 173. A third GRIN lens with 0.25 pitch collimates the final laser light $\lambda_l$ output by fiber 173.

We claim:

1. An upconversion fiber laser, comprising an optical fiber having a central core doped with an active lasing ionic species, an inner cladding surrounding said central core and having a lower refractive index than said central core, said inner cladding having a noncircular cross section, and an outer cladding surrounding said inner cladding and having a lower refractive index than said inner cladding, said active lasing ionic species capable when optically pumped of undergoing upconversion excitation, a laser-diode-based laser pumped source optically coupled at least into said inner cladding, said inner cladding forming a waveguide for pump light emitted by said laser-diode-based laser pump source, and means for defining a resonant cavity containing at least a portion of said optical fiber.

2. The laser of claim 1 wherein said central core of said optical fiber is capable of supporting only a single spatial mode of light propagation.

3. The laser of claim 2 wherein said central core has a diameter of at most 10 μm.

4. The laser of claim 2 wherein said central core and said inner cladding in combination are together capable of supporting multiple spatial modes of propagation of said pump light.

5. The laser of claim 4 wherein said inner cladding has an outer dimension in a range from 25 μm to 1 mm.

6. The laser of claim 1 wherein said laser-diode-based laser pump source is a laser bar comprising a monolithically integrated array of multiple laser light emitting elements, wherein the array is substantially wider than the diameter of said central core.

7. An upconversion fiber laser, comprising an optical fiber having a central core doped with an active lasing ionic species, an inner cladding surrounding said central core and having a lower refractive index than said central core, and an outer cladding surrounding said inner cladding and having a lower refractive index than said inner cladding, said active lasing ionic species capable when optically pumped of undergoing upconversion excitation, a high power laser diode pump source having a broad emitting aperture which is substantially wider than the diameter of said central core, said high power laser diode pump source with broad emitting aperture being selected from the group consisting of a flared-resonator-type laser diode, a monolithic flared-amplifier-type MOPA device, and a broad area laser diode, pump light emitted by said laser diode pump source optically coupled at least into said inner cladding, said inner cladding forming a waveguide for said pump light, and means for defining a resonant cavity containing at least a portion of said optical fiber.

8. An upconversion fiber laser, comprising an optical fiber having a central core doped with an active lasing ionic species, an inner cladding surrounding said central core and having a lower refractive index than said central core, and an outer cladding surrounding said inner cladding and having a lower refractive index than said inner cladding, said active lasing ionic species capable when optically pumped of undergoing upconversion excitation, a laser-diode-based laser pump source including multiple lasers, beam combining means for coupling pump light emitted from each of said multiple lasers at least into said inner cladding of said optical fiber, said inner cladding forming a waveguide for said pump light, and means for defining a resonant cavity containing at least a portion of said optical fiber.

9. The laser of claim 8 wherein said multiple lasers are a monolithic array of semiconductor lasers, and said beam combining means includes at least one cylinder lens disposed in front of said array of lasers.

10. The laser of claim 9 wherein said beam combining means further includes an array of optical fibers which are arranged at an input end in front of the array of lasers to accept light therefrom and arranged at an output end in a bundle configured to inject light from the fibers at least into said inner cladding of the upconverting laser fiber.

11. The laser of claim 8 wherein said multiple lasers provide light of multiple wavelengths for optically pumping said active laser ionic species doping said central core.

12. The laser of claim 11 wherein said multiple wavelengths correspond to at least two different pump absorption bands of said active laser ionic species in said central core.

13. The laser of claim 11 wherein said multiple wavelengths coincide with a single broad pump absorption band of said active laser ionic species in said central core.

14. The laser of claim 8 wherein said multiple lasers provide light of two crossed linear polarizations.

15. The laser of claim 1 or 8 wherein said resonant cavity defining means includes at least one reflective end face of said optical fiber.

16. An upconversion fiber laser, comprising an optical fiber having a central core doped with an active lasing ionic species, an inner cladding surrounding said central core and having a lower refractive index than said central core, and an outer cladding surrounding said inner cladding and having a lower refractive index than said inner cladding, said active lasing ionic species capable when optically pumped of undergoing upconversion excitation, said central core being co-doped with a sensitizer ionic species selected to facilitate said upconversion excitation of said active lasing ionic species, a laser-diode-based laser pump source optically coupled at least into said inner cladding, said inner cladding forming a waveguide for pump light emitted by said laser pump source, and means for defining a resonant cavity containing at least a portion of said optical fiber.

17. The laser of claim 16 wherein said active laser ionic species and said sensitizer ionic species are both rare earth ionic species.

18. The laser of claim 17 wherein said sensitizer ionic species is selected from the group consisting of $Nd^{3+}$ and $Yb^{3+}$.

19. The laser of claim 1 or 16 wherein said laser-diode-based laser pump source is a laser-diode-pumped fiber laser, laser light emitted from said fiber laser being said pump light optically coupled into at least said inner cladding of said optical fiber.

20. The laser of claim 1 or 16 wherein said active laser ionic species is a rare earth ionic species.

21. The laser of claim 20 wherein said rare earth ionic species is selected from the group consisting of $Tm^{3+}$, $Er^{3+}$, $Pr^{3+}$, and $Ho^{3+}$.

22. The laser of claim 1, 8 or 16 wherein said optical fiber is composed of a fluoride glass fiber material.

23. The laser of claim 1, 8 or 16 wherein said resonant cavity defining means includes at least one reflective grating formed within said optical fiber.

24. The laser of claim 23 wherein a portion of said optical fiber lies outside of said resonant cavity, said portion acting as an optical power amplifier.

25. The laser of claim 1 or 16 wherein said central core comprises an inner first core region surrounded by an outer second core region.

26. The laser of claim 25 wherein first and second core regions are doped with different ionic species.

27. An upconversion fiber laser, comprising an optical fiber contained at least partially within a resonant laser cavity and having a central core region doped with an ionic species capable of lasing at a first upconversion wavelength, said central core region embedded in a second region of said fiber doped with an ionic species capable of lasing at a second wavelength, said second wavelength exciting upconversion in said central core region, and means for pumping said second region, wherein said means for pumping is a second fiber laser optically coupled to said second region.

28. The laser of claim 27 further comprising means for reflecting light in said optical fiber of both said first and second wavelengths.

29. The laser of claim 27 wherein said central core region and said second region are embedded within an inner cladding region which in turn is embedded within an outer cladding region of said optical fiber.

30. The laser of claim 29 wherein each of said central core, second and inner cladding regions has a higher refractive index than the region in which it is embedded.

31. The laser of claim 27 wherein said means for pumping is a diode laser with an emitting aperture substantially larger than a minimum dimension of said central core region.

32. The laser of claim 31 wherein said diode laser is a fiber-coupled laser array.

33. The laser of claim 27 wherein said means for pumping comprises a plurality of lasers and means for combining light emitted from said plurality of lasers into a single pump beam, said single pump beam optically coupled into said central core and second region.

34. The laser of claim 33 wherein at least two of said plurality of lasers emit light of crossed linear polarizations.

35. The laser of claim 27 wherein said means for pumping comprises a plurality of lasers emitting light of different wavelengths.

36. The laser of claim 35 wherein at least two of said different wavelengths correspond to the same pump absorption band of said second region.

* * * * *